United States Patent [19]

Baran et al.

[11] Patent Number: 4,857,837
[45] Date of Patent: Aug. 15, 1989

[54] MAGNETO RESISTIVE CURRENT SENSOR WITH IMPROVED FIDELITY

[75] Inventors: Mich S. Baran, Wauwatosa; Bruce C. Beihoff, Glendale; Michael A. Damiano, Germantown; James E. Hansen, Oak Creek; Jerome K. Hastings, Sussex; Allen J. Slomczewski, Milwaukee; Charles J. Tennies, Waukesha, all of Wis.

[73] Assignee: Eaton Corporation, Cleveland, Ohio

[21] Appl. No.: 139,352

[22] Filed: Dec. 29, 1987

[51] Int. Cl.$^4$ .................. G01R 19/00; G01R 1/20
[52] U.S. Cl. .................. 324/117 R; 324/127
[58] Field of Search ............ 324/117 R, 117 H, 127, 324/251, 252; 307/309

[56] References Cited

U.S. PATENT DOCUMENTS 4,520,311  5/1985  Petr et al. ................ 324/117 R

Primary Examiner—Ernest F. Karlsen
Attorney, Agent, or Firm—Krass & Young

[57] ABSTRACT

The present invention is a current sensor employing a magneto resistive sensor having high fidelity of output. This current sensor includes a magnetic flux concentrator substantially encircling the electrical conductor having magnetic sensing, a magnetic device generating a magnetic field component along an axis offset from the principle axis, a magneto resistive device disposed in the magnetic sensing region, a constant current source supplying a predetermined constant current to said magneto resistive device, and a voltage sensing circuit connected to said magneto resistive device for measuring resistance by measuring a difference voltage induced by said constant current. This measured voltage corresponds to the current through the conductor. The magneto resistive device is formed as a Wheatstone bridge having a first and second pair of opposite terminals. The constant current source provides a predetermined constant current whereby the change with temperature in the differential voltage between said second pair of terminals is equal and opposite to the change in voltage of the total bridge resistance with temperature and the change in the bridge offset voltage with temperature.

13 Claims, 7 Drawing Sheets

MAGNETO RESISTIVE CURRENT SENSOR WITH IMPROVED FIDELITY

TECHNICAL FIELD OF THE INVENTION

The present invention relates to current sensors for measuring electrical current in a conductor and is particularly directed to current sensors for aerospace or other high performance applications where extreme accuracy, extended range of operation, lightweight and compact design represent premium feature.

CROSS-REFERENCE TO RELATED APPLICATION

This application is related to a copending application entitled "Current Sensor for Universal Application," application Ser. No. 061,355, filed June 11, 1987, now U.S. Pat. No. 4,791,361, in the name of Jerome K. Hastings, Bruce C. Beihoff, Michael S. Baran, Mark A. Juds, and James E. Hansen, and assigned to the assignee of this application and to a copending application entitled "MRS Current Sensor," application Ser. No. 061,351, filed June 11, 1987 in the name of Jerome K. Hastings, Bruce C. Beihoff, Michael S. Baran, Mark A. Juds, and James E. Hansen, and assigned to the assignee of this application.

BACKGROUND OF THE INVENTION

It is known to detect and measure the current flowing in an electrical conductor by disposing a current transformer around the conductor to pick up the magnetic flux generated by the current in the conductor and, with appropriate circuitry and indicating instruments, relate that flux to a measurement of the current flowing in the conductor. Current transformers are generally large, heavy devices and are not well suited for high performance applications where lightweight, great accuracy, and reliable operation through extreme temperature changes is required.

Hall effect sensors have, likewise, been applied to measure current. However, they tend to be fragile and range limited, and are thus unsuitable in some applications. Furthermore, Hall sensors do not provide field shaping or transformer action needed to concentrate magnetic flux field for extremely sensitive contactless measurement.

Current shunts are frequently employed to measure extremely high currents. However, shunts tend to be heavy and expensive. Furthermore, shunts are placed in series circuit with a conductor carrying the measured current and can represent a safety hazard if they fail in an open circuit condition. Considerations of reliability and weight are particularly acute in aerospace applications where system designs frequently dictate use of dozens of such devices.

SUMMARY OF THE INVENTION

The present invention provides a new and improved current sensor for measuring current flow in an electrical conductor. Specifically, the present invention includes a magnetic flux concentrator having a magnetic pole structure substantially encircling the cross-sectional shape of the conductor with two magnetic pole portions which are spaced from one another to provide a magnetic sensing region therebetween. Electrical current flowing in the conductor will induce a magnetic field in the region. Means are provided to measure a component of magnetic field intensity along a principle axis within the sensing region and to further generate an output signal as a function thereof. Finally, means are provided to generate a biasing component of magnetic field intensity within the region along a second axis, offset from the principle axis, such as the offset component of magnetic field intensity is unaffected by flow of current in the conductor. This arrangement has the advantage of providing an increase in sensing range without increasing the weight or size of the device and further protects the device from overload due to an unsually high current.

According to another aspect of the invention, the means operative to generate the magnetic field bias comprises a permanent magnet, coil or equivalent device disposed adjacent a magneto resistive sensor within the sensing region and oriented to produce a magnetic field essentially normal to the field created by current flowing in the conductor. This arrangement provides the advantage of a constant biasing field which can be easily adjusted for scaling or temperature compensation.

According to another object of the invention, the electronic sensor arrangement provides compensation for any change in temperature in the magneto resistive sensor using a controlled current source having a predetermined current. This arrangement has the advantage of providing a better indication of current for a wider range of ambient temperatures.

BRIEF DESCRIPTION OF THE DRAWINGS

Various other features and advantages of the present invention will become apparent upon a reading of the following specification, which, along with the patent drawings, describes preferred and alternative illustrative embodiments of the invention in detail. The detailed description of the specific embodiments makes reference to the accompanying drawings in which.

DETAILED DESCRIPTION OF THE PREFERRED EMBODIMENTS

Figure 1:
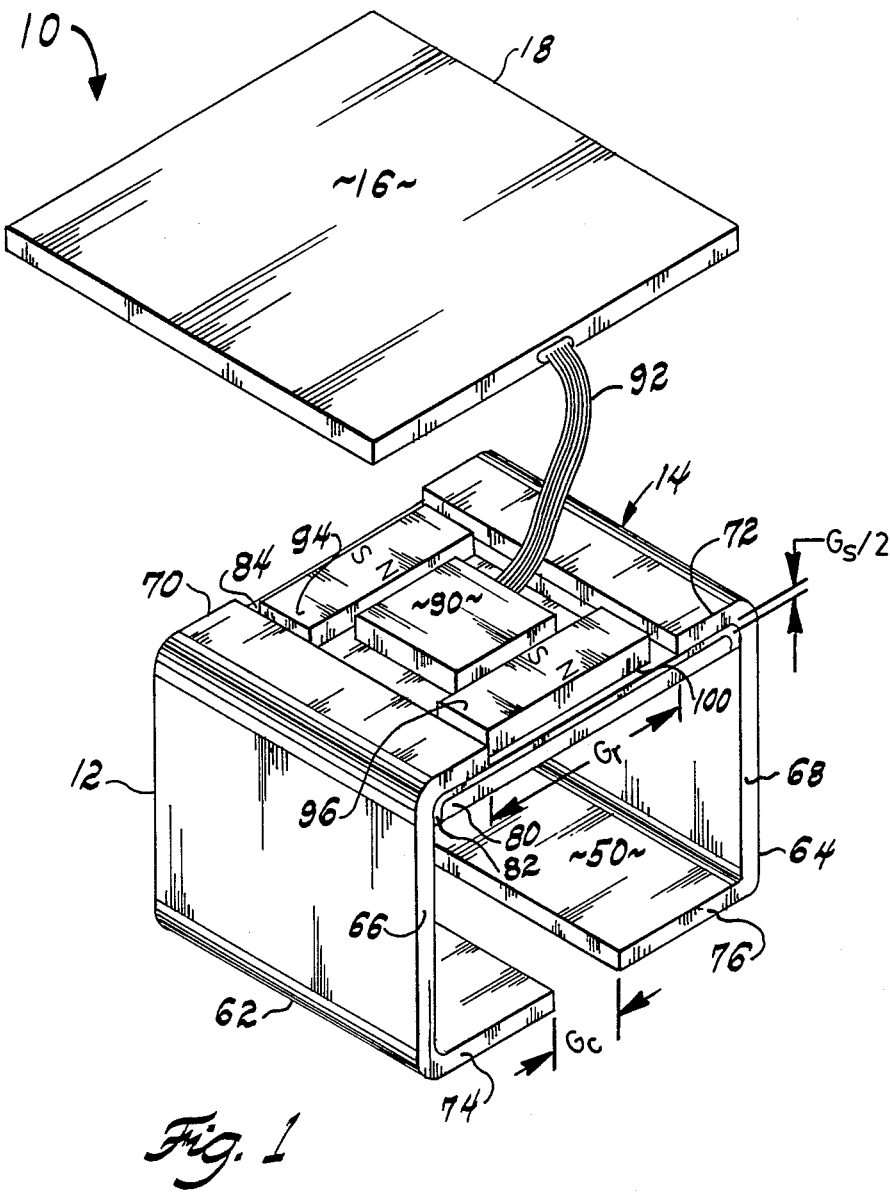
FIG. 1 is an isometric view of the flux concentrator and circuit board of the current sensor of the present invention.
Figure 2:
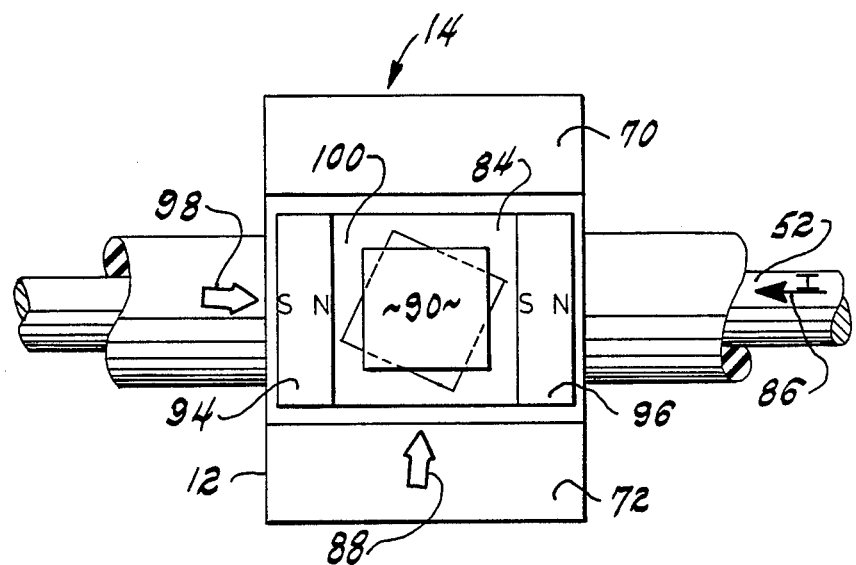
FIG. 2 is a top plan view of the flux concentrator of FIG. 1 for the preferred embodiment of the present invention and for an alternative embodiment.

Referring to FIGS. 1 and 2, the preferred embodiment of a magneto resistive sensor (MRS) based current sensor 10 is illustrated. Sensor 10 has a flux concentrator 14 and a control circuit 16 (shown schematically in FIG. 3) carried on a control circuit board 18 therein. Housing assembly 12 has its top and side portions substantially closed. The ends of housing assembly 12 are open to define a generally rectangular through-passageway 50 to receive one or more insulated electrical conductors 52 therethrough. Flux concentrator 14 is generally square in cross-section and is opened as its ends to permit conductor 52 to extend therethrough. As can best be seen in FIG. 1, flux concentrator 14, is formed of two generally C-shaped pole pieces 62 and 64 which coact to form a magnetic pole structure which substantially encircles the cross-sectional shape of conductor 52. Pole pieces 62 and 64 comprises complementarily shaped vertically disposed riser portions 66 and 68, respectively, and an upper pair of horizontally oriented inwardly directed pole portions or pieces 70 and 72 integrally depending from riser portions 66 and 68, respectively. Flux concentrator 14 further includes a lower pair of horizontally disposed inwardly directed pole portions or pieces 74 and 76 integrally depending from riser portions 66 and 68, respectively.

Pole portions 70 and 72 are spaced by a horizontal gap designated $G_r$ and lower pole portions 74 and 76 are separated by horizontal calibration gap designated $G_c$ as will be described in detail hereinbelow. A rib member (not shown) extends into calibration gap $G_c$ to insure that the spacing between lower pole portions 74 and 76 is maintained. Pole pieces 62 and 64 are formed of a low carbon magnetically conductive ferrous material such as steel. In application, insulating spacer means (not shown) are preferably provided to ensure that conductor 52 is rigidly maintained at or near the central axis of passageway 50.

As illustrated in FIG. 1, upper pole portions 70 and 72 are bridged by a magnetically conductive shunt 80. Shunt 80 is held in position by any suitable non-magnetically conductive fastening means (now shown) and is insulated from riser portions 66 and 68 and upper pole portions 70 and 72 by a thin layer of phenolic insulating material 82. Insulating material 82 thus spaces shunt 80 from each upper pole portion 70 and 72 by a dimension designated $G_s/2$ as will be described in detail herein below. The space between upper pole portions 70 and 72 adjacent shunt 80 is designated as a magnetic sensing region 84. Shunt 80 is formed of any suitable material having a characteristic permeability equal to or exceeding the characteristic permeability of the material in pole pieces 62 and 64. Flux concentrator 14 thus defines a magnetic circuit including pole pieces 62 and 64, series calibration gap $G_c$ between the lower pole portions 74 and 76, a second series gap, designated $G_r$ defined between upper pole portions 70 and 72, and a shunt 80 with series gap designated $G_s$ (one of dimension $G_s/2$ at each end of shunt 80) disposed in parallel with gap $G_r$. When the current carrying conductor 52 extends through passageway 50, a magnetic field will be induced within sensing region 84 proportional to the current flow.

Referring to FIG. 2, assuming current flow within conductor 52 is in the direction designated by arrow 86, a magnetic field will be induced in sensing region 84 characterized by lines of flux having a principle axis in the direction designated by arrow 88 which, for the purposes of this application is defined as the measured field. Shunt 80 operates to divert substantial portion of the total flux within flux concentrator 14 from sensing region 84. Accordingly, measurement means placed within region 84 can provide extreme accuracy while reading only a small percentage of the induced field.

Sensing of the field is effected by the use of an magneto resistive sensor of the type manufactured by Amperex Division of North American Phillips Model KMZ10C90 disposed centrally within region 84 and aligned to measure the field along principle axis 88. Magneto resistive sensor 90 is electrically interconnected with control circuit 16 by wires 92. Permanent magnets 94 and 96 are disposed within sensing region 84 adjacent the sides of magneto resistive sensor 90 and oriented to establish a biasing component of magnetic field intensity along an offset biasing axis normal to the principle axis 88 designated by arrow 98. Although two magnets 94 and 96 are illustrated, it is contemplated that more or fewer could be employed. However, the applicants have found that a pair of magnets astride magneto resistive sensor 90 with reinforcing pole orientation provides satisfactory sensor performance. Moreover, other means of establishing a biasing component of magnetic field intensity along an offset biasing axis normal to the principle axis are also contemplated herein, such as electrically controlled electromagnetic coils, additional magnetic flux concentrators, or other similar devices.

A magnetic return path is provided for the biasing field by a thin layer of mu-metal 100 within region 84 underlying magneto resistive sensor 90 and magnets 94 and 96. Magnets 94 and 96 and return path 100 are spaced from upper pole portions 70 and 72.

The sensor 10 described hereinabove was specifically intended for ±100 ampere DC current application. It is contemplated however that various spatial relationships between gaps $G_r$, $G_c$, $G_s$ could be varied as well as the relative placement of magneto resistive sensor 90 and magnets 94 and 96 with respect to flux concentrator 14 depending upon the particular application, sensitivity and range sought. If sensor 10 is to be employed in an environment of high electromagnetic fields, shielding can be provided to render sensor 10 substantially immune from externally generated fields. In such case, a magnetic shield is placed over the upper surface of upper pole portions 70 and 72 and wrapped downwardly along riser portions 86 and 88 to a point at least below the lowermost surface of shunt 80. The shield, also overlies sensing region 84 and the components disposed therein.

Although gap dimensions can be adjusted for a given application the applicants have found that the spatial relationship of $G_s \leq G_c \leq G_r$ applies.

Figure 3:
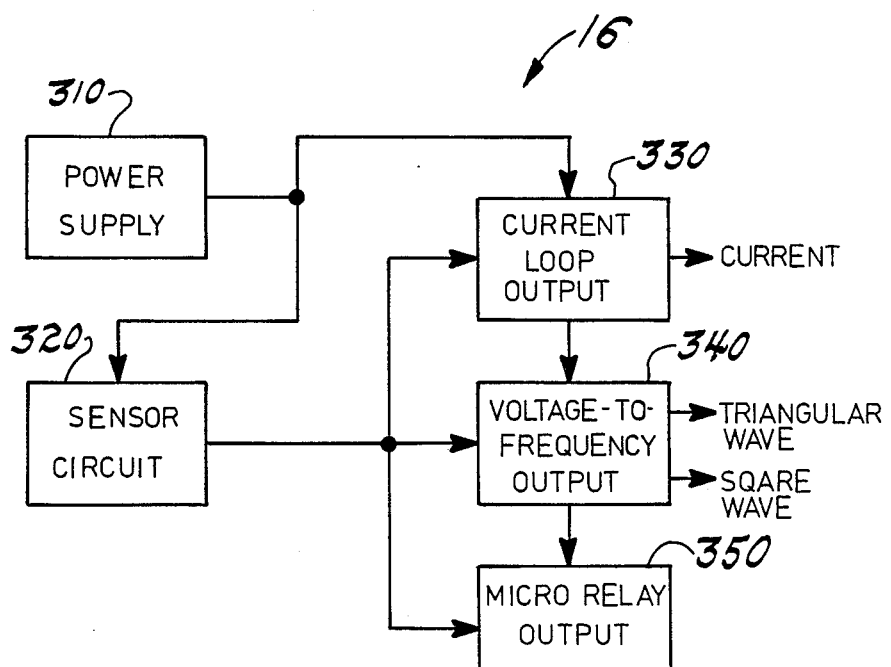
FIG. 3 is a block diagram of the electronic circuit of the present invention.

The electronic circuit 16 mounted on circuit board 18 is illustrated schematically in FIG. 3. This electronic circuit consists of power supply 310, sensor circuit 320, current loop output circuit 330, voltage-to-frequency output circuit 340 and micro relay output circuit 350.

Power supply 310 receives line power (or electric power from another primary power source) and generates the voltages necessary to operate the rest of the circuits illustrated in FIG. 3. Power supply 310 includes primary power supply 400 and secondary power supply 420. Primary power supply 400 includes the connection of power supply 310 to a DC power line 401. This would typically be from a vehicle or aircraft 28 volt DC source. Power supply lamp 402 is illuminated when power is supplied. Zener diode 403 and resistor 404 form a voltage divider to limit the voltage supplied the input of the DC regulator 407, particularly during voltage surges and transient spikes. Zener diode 403 has a breakdown voltage of 33 volts in accordance with the preferred embodiment of the present invention. Diode 405 isolates, or decouples, the regulator input from negative going voltage transients on the input and capacitor 406 acts as a reserve voltage source to its regulator during short intervals when the input may go low or be interrupted. The power supply regulator circuit is preferably a LM7812 in accordance with the preferred embodiment of the present invention. The output of power supply regulator 407 is further filtered via a filter circuit consisting of resistor 408 and capacitors 409 and 410. Thus primary power supply section 400 provides a positive voltage V+ output at terminal 411 and a ground voltage output at terminal 412. In accordance with the preferred embodiment the positive power supply voltage V+ is 12 volts.

Secondary power supply 420 provides a virtual ground so that power supply 310 can provide virtual bipolar power (V+, GND and V−) to the operational amplifiers employed in electronic circuit 300 from a single polarity (V+ and GND) source. Operational amplifier 421 drives a voltage follower formed of transistors 422 and 423. A bias voltage derived from the V+ power supply at terminal 411 is applied to the noninverting input of operational amplifier 421. This is formed by a voltage divider circuit including resistors 424, 425, 426 and 427, capacitor 428 and zener diode 429. Zener diode 429 preferably has a breakdown voltage of 6.4 volts to place a bias voltage of 6 volts at the noninverting input of operational amplifier 421.

Resistor 430 provides feedback from output terminal 440 to the inverting input of operational amplifier 421. This feedback tends to stabilize the output voltage at terminal 440 at the input bias voltage applied to the noninverting input of operational amplifier 421, minimizing any error in the voltage at 440 due to resistance of resistor 432 or effects of transistors 422 and 423.

The output voltage follower consists of transistors 422 and 423, resistors 431 and 432, zener diode 433 and capacitor 434. Transistors 422 and 423 are connected together in a common base, common emitter totem pole circuit. Base drive for these transistors is received from the output of operational amplifier 421. These two transistors form a voltage follower which generates an output at substantially the same voltage as the input at their bases, while providing greater current drive capability. Zener diode 433 and resistor 432 provide over voltage protection from transients which may be induced back into the circuit from long lines tied to the ground reference at point 440. Zener diode 433 preferably has a breakdown voltage of 20 volts. Capacitor 434 is employed to provide output smoothing.

The output at terminal 440 is the virtual ground for the bipolar power system. Rather than operate with a true bipolar power supply, secondary power supply 420 provides a virtual ground for a virtual bipolar power supply. The V+ power input of the operational amplifier circuits are connected to V+ at terminal 411; the ground input of the operational amplifier circuits are connected to the virtual ground at terminal 440, which is preferably set to 6 volts or one half the regulated supply voltage; and the V− input of the operational amplifier circuits are connected to the true ground at terminal 412.

Sensor circuit 320 is coupled to the magneto resistive sensor 90 and generates a voltage output signal corresponding to the resistance of the magneto resistive sensor. Sensor circuit 320 includes a constant current source 510, a sensing differential amplifier circuit 520 and an output driver circuit 540.

Constant current source 510 supplies a constant current through opposite terminals of magneto resistive sensor 90. Magneto resistive sensor 90 is formed as a Wheatstone bridge of resistances. This arrangement permits a more sensitive measurement of the resistance which varies with magnetic flux. Constant current source 510 supplies a constant current through terminals 2 and 4 of magneto resistive sensor 90. The voltage across terminals 1 and 3 is measured by the sensing differential amplifier circuit 520 thereby providing a measure of the resistance of magneto resistive sensor 90. This provides a measure of the magnetic flux through the sensor.

Constant current source 510 includes an operational amplifier 501 and a plurality of resistors 502, 503, 504, 505 and 506. The inverting input of operational amplifier 501 is connected to ground at terminal 507 via resistor 502. The noninverting input of operational amplifier 501 is connected to virtual ground at terminal 508 via resistor 503. Negative feedback is provided via resistor 504, while positive feedback is provided via resistors 505 and 506. This circuit forms a Howland constant current source which supplies current from the junction between resistors 505 and 506. Resistors 504 and 505 are selected to have the same resistance. Because of the large gain available from operational amplifier 501, the voltage at the inverting and noninverting inputs must be very nearly the same. Otherwise operational amplifier 501 would produce a large output voltage. Therefore the voltage across resistor 504 must very nearly equal the voltage across the two resistors 505 and 506. The resistance value of resistor 506 determines the amount of current supplied from the terminal between resistors 505 and 506. As will be further explained below, the particular current supplied is selected to compensate for temperature changes in the resistance of magneto resistive sensor 90.

Sensing differential amplifier circuit 520 includes operational amplifier 521. The inverting input of operational amplifier 521 is connected to terminal 1 of magneto resistive sensor 90 via resistor 522. The noninverting input of operational amplifier 521 is connected to terminal 3 of magneto resistive sensor 90 via resistor 523. Preferably resistors 522 and 523 have like values. The noninverting input of operational amplifier 521 is further connected to a voltage divider potentiometer 526. Potentiometer 526 is coupled between terminals 2 and 4 of magneto resistive sensor 90, thereby receiving a part of the current from current source 510. The controlled terminal of potentiometer 526 is connected to the noninverting input of operational amplifier 521 via resistor 527. Potentiometer 526 is adjusted to provide a zero output from sensing differential amplifier circuit 520 for zero current through conductor 52.

Sensing differential amplifier circuit 520 includes combination of positive and negative feedback in order to provide a wide range of gain adjustment via a single control. Negative feedback from the output of operational amplifier 521 to the inverting input is provided via a pair of like resistors 524 and 525. Positive feedback is provided via a pair of resistors 528 and 529 and potentiometer 530. Resistors 528 and 529 have like values as resistors 524 and 525. Resistors 528 and 529 are coupled in series between the noninverting input of operational amplifier 521 and ground. Potentiometer 530 is connected between the node between resistors 524 and 525 and the node between resistors 528 and 529. The setting of potentiometer 530 controls the amount of positive feedback provided to operational amplifier 521, and hence the gain of this circuit. The output of the sensing differential amplifier circuit 520 is provided at terminal 531.

Output driver circuit 540 is provided to provide improved drive capability for the output of sensing circuit 320. This circuit is a voltage follower consisting of transistors 542 and 543, and resistors 541 and 542. The output is provided at terminal 546. Zener diode 545, which is connected between the common emitter junction of transistors 542 and 543 and ground, is included to provide over voltage protection from transients induced on long lines which may be connected to output point 546.

As previously mentioned, the magnitude of current supplied by constant current source 510 is selected for temperature compensation. The magneto resistive sensor 90 has a known positive temperature coefficient of the resistance. With a change in temperature the resistance of magneto resistive sensor 90 changes, the resistance increasing for increasing temperature. This causes the voltages measured at terminals 1 and 3 to change. The measurement is further complicated because any practical sensor employed as magneto resistive sensor 90 will have small imbalances or differences in resistance among the four bridge resistances. Potentiometer 526 is provided to enable zeroing of the difference in voltage due to the imbalance in resistances when no current flows through conductor 52. This provides initial calibration, but does not take into account changes with temperature.

The current supplied by constant current source 510 is selected so that the difference in voltage at these two terminals is relatively stable. This is achieved by setting the current supplied so that the change with temperature of the differential voltage between terminals 1 and 3 is equal and opposite to the change in voltage of the total bridge resistance with temperature and the change in the bridge offset voltage with temperature. This current will be a different value for each sensor type and therefore must be computed for each sensor type.

This current value can be approximated using a rule of thumb. As a first order approximation the resistance of resistor 506 is set as a percentage of the resistance of the individual legs of the Wheatstone bridge of magneto resistive sensor 90. Note from the discussion above that the value of resistance 506 determined the current supplied by constant current source 510. It has been found that temperature variations within magneto resistive sensor 90 are substantially compensated if the resistance of resistor 506 is 28% of the resistance of the individual legs of the Wheatstone bridge for sensors with leg resistances up to about 10 kilo ohms, and 18% of the resistance of the individual legs for sensors with leg resistances of greater than 10 kilo ohms.

There are three output circuits which can be used either alone or in any combination. Current loop output circuit 330 provides a current signal proportional to the voltage output of sensor circuit 320 and is useful in driving long lines to the utilization circuit. Voltage-to-frequency output circuit 340 generates two outputs which have a frequency proportional to the voltage output of the sensor circuit 320. Lastly, micro relay output circuit 350 has an adjustable level for tripping one or more micro relays dependent upon the voltage output of the sensor circuit.

Current loop output circuit 330 is a controlled current source. This circuit is very similar to the constant current circuit 510 which is a part of sensing circuit 320. The input from output terminal 546 is connected to input terminal 601. The virtual ground signal from terminal 440 is applied to input terminal 602. These signals together with resistors 611 and 612 determine the current output of the circuit. Note that operational amplifier 610 is made sensitive to the difference between the output from terminal 546 of sensing circuit 320 and the virtual ground signal from terminal 440 of power supply 310. Operational amplifier 610 is connected with resistors 613, 614 and 619 in the much the same manner at operation amplifier 501 and resistors 504, 505 and 506 of constant current source 510, with the addition of the voltage follower circuit including resistors 615 and 616 and transistors 617 and 618. This voltage follower circuit provides greater current drive capacity that possible from operation amplifier 610 alone. Zener diode 621 provides over voltage protection. Capacitor 622 provides filtering of the output signal. Current loop output circuit 330 provides a current output that is proportional to the voltage output from terminal 546 of sensing circuit 320. This is in turn proportional to the current through conductor 52. The use of such a current driver is advantageous when the output signal must be sent down a long transmission line to the device utilizing this signal.

Voltage-to-frequency output circuit 340 provides two output signals whose frequency is proportional to the measured current through conductor 52. A unity gain amplifier circuit consisting of operational amplifier 710 and resistors 711, 712, 713, 714 and 715 buffers the input signal provided by the difference in voltage between the the output from terminal 546 of sensing circuit 320 appearing at input terminal 701 and the virtual ground signal from terminal 440 of power supply 310 appearing at input terminal 702.

A voltage controlled oscillator 720 provides the frequency standard. This voltage controlled oscillator 720 is preferably an Exar XR2209. The frequency of the output is controlled by capacitor 721 and the voltage applied at the input terminal, the voltage across resistor 715. This frequency is given by the equation:

$$F_{out} = F_{center} * [(1 + (R_1/R_2) - V_{out}/V_{vgnd} + 0.6) * (R_1/R_2)]$$

where $F_{out}$ is the output frequency; $F_{center}$ is $1/(R_1*C)$; $R_1$ is the resistance of resistor 715, $R_2$ is the resistance of resistor 714; $V_{out}$ is output voltage from terminal 546 of the sensor circuit 320 received at terminal 701; $V_{vgnd}$ is the virtual ground voltage from terminal 440 of power supply 310 received at terminal 702; and C is the capacitance of capacitor 721. A square wave output is generated at terminal 7 and a triangular wave output is generated at terminal 8.

Figure 4:
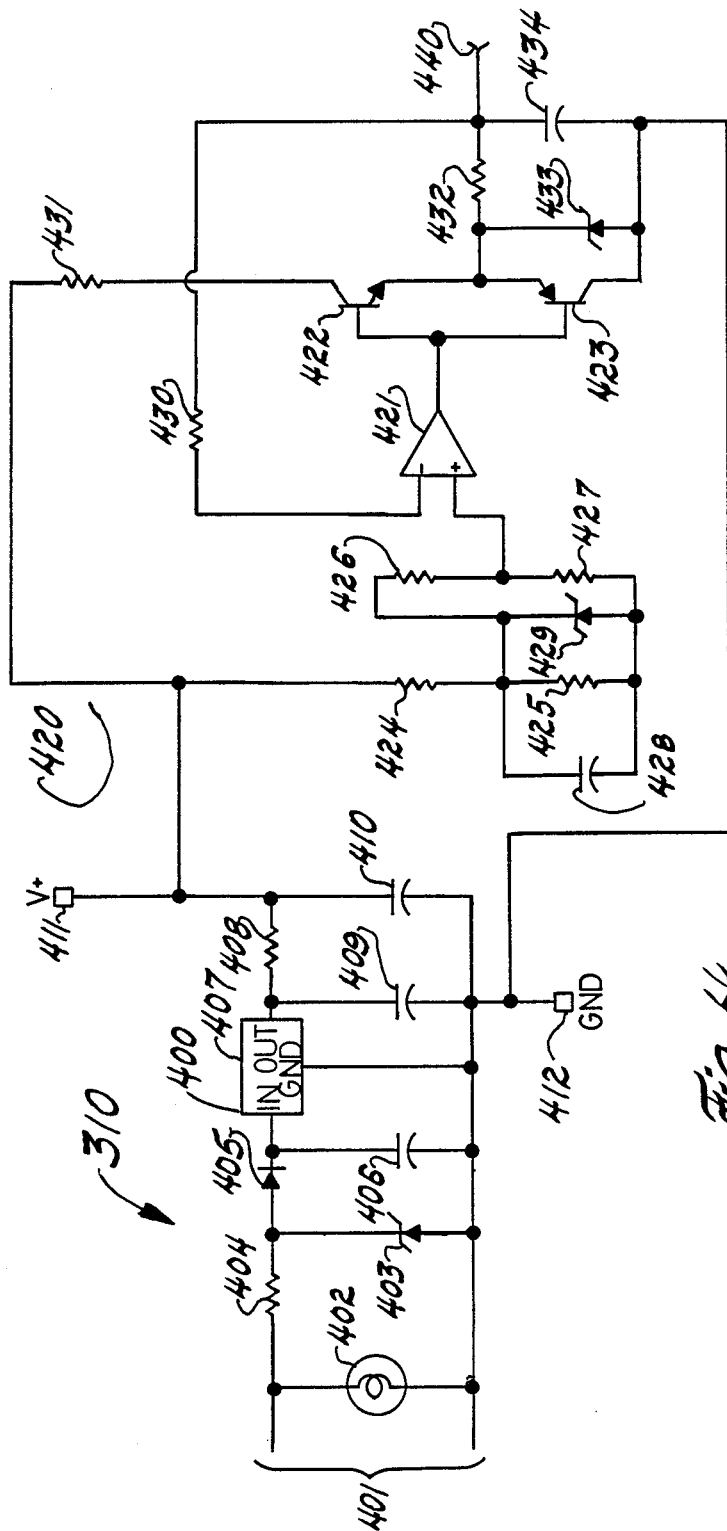
FIG. 4 is a schematic diagram of the power supply in accordance with the preferred embodiment of the present invention.
Figure 5:
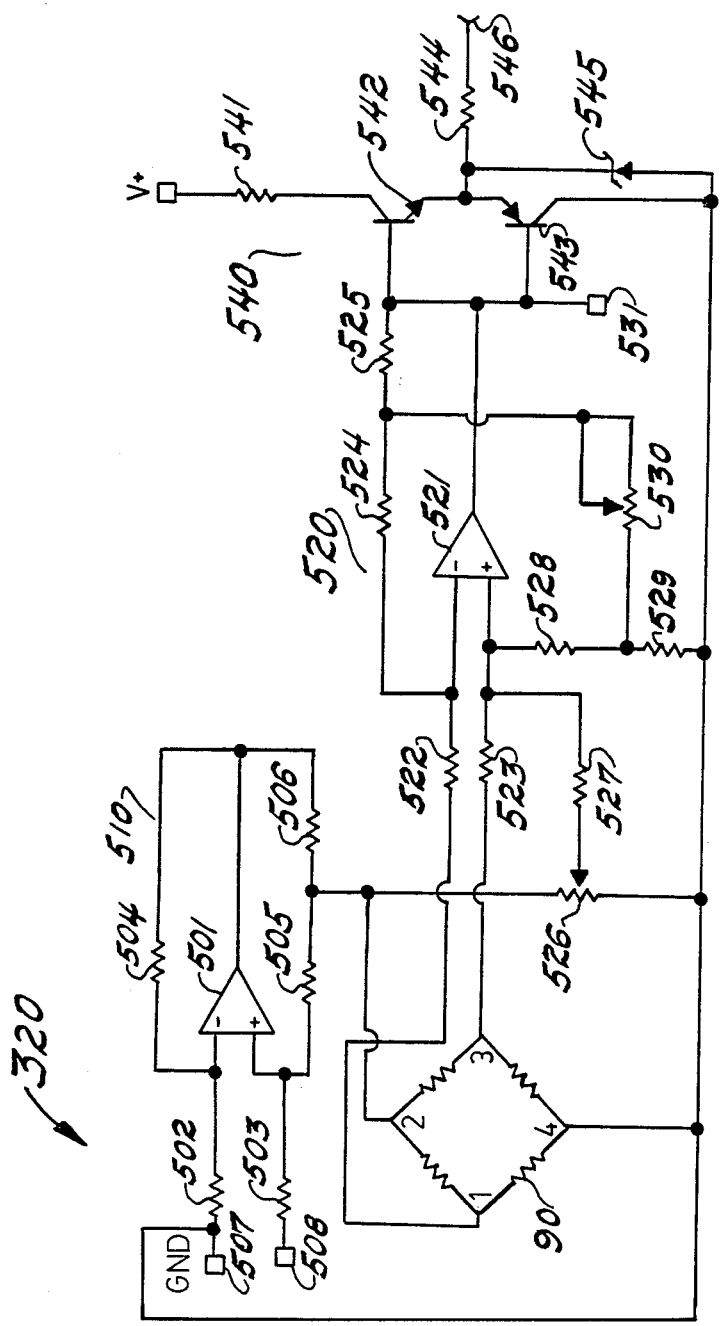
FIG. 5 is a schematic diagram of the sensor circuit in accordance with the preferred embodiment of the present invention.
Figure 6:
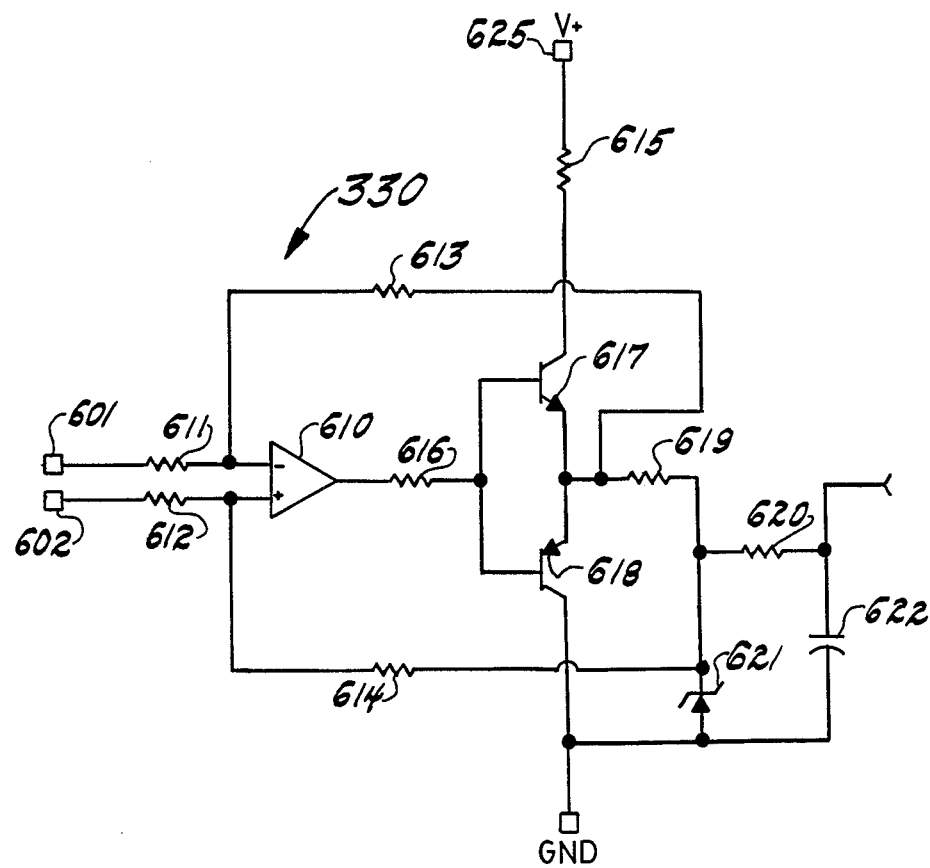
FIG. 6 is a schematic diagram of the current loop output circuit in accordance with the preferred embodiment of the present invention.
Figure 7:
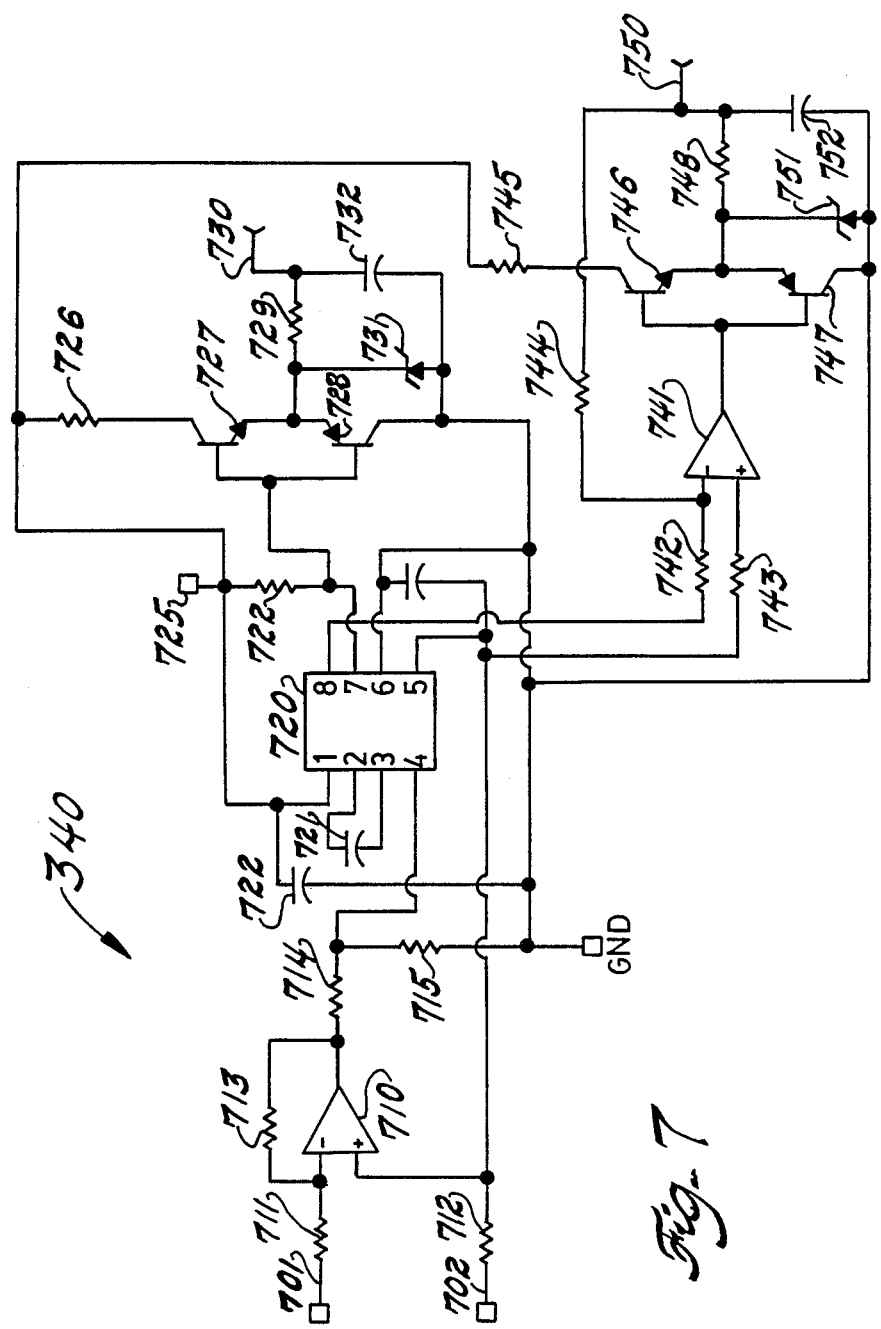
FIG. 7 is a schematic diagram of the voltage-to-frequency output circuit in accordance with the preferred embodiment of the present invention.

The square wave output at terminal 7 of voltage controlled oscillator 720 is coupled to a voltage follower circuit including resistors 722 (which couples this output to the supply voltage V+ at terminal 725), 726 and 729, transistors 727 and 728, zener diode 731 and capacitor 732. This circuit is very similar to voltage follower circuits previously described in regard to FIGS. 4 and 6. This voltage follower generates the square wave output at terminal 730.

The triangular wave output at terminal 8 of voltage controlled oscillator 720 is coupled to a buffer amplifier circuit. This buffer amplifier circuit includes a unity gain amplifier and a voltage follower. The unity gain amplifier includes resistors 742, 743 and 744, and operational amplifier 741. The output of operational amplifier drives a voltage follower inside the feedback loop including resistors 745 and 748, transistors 746 and 747, zener diode 751 and capacitor 752. This circuit is similar to the circuit illustrated in FIG. 4 which generates the virtual ground voltage. This buffer amplifier generates the triangular wave output at terminal 750.

Figure 8:
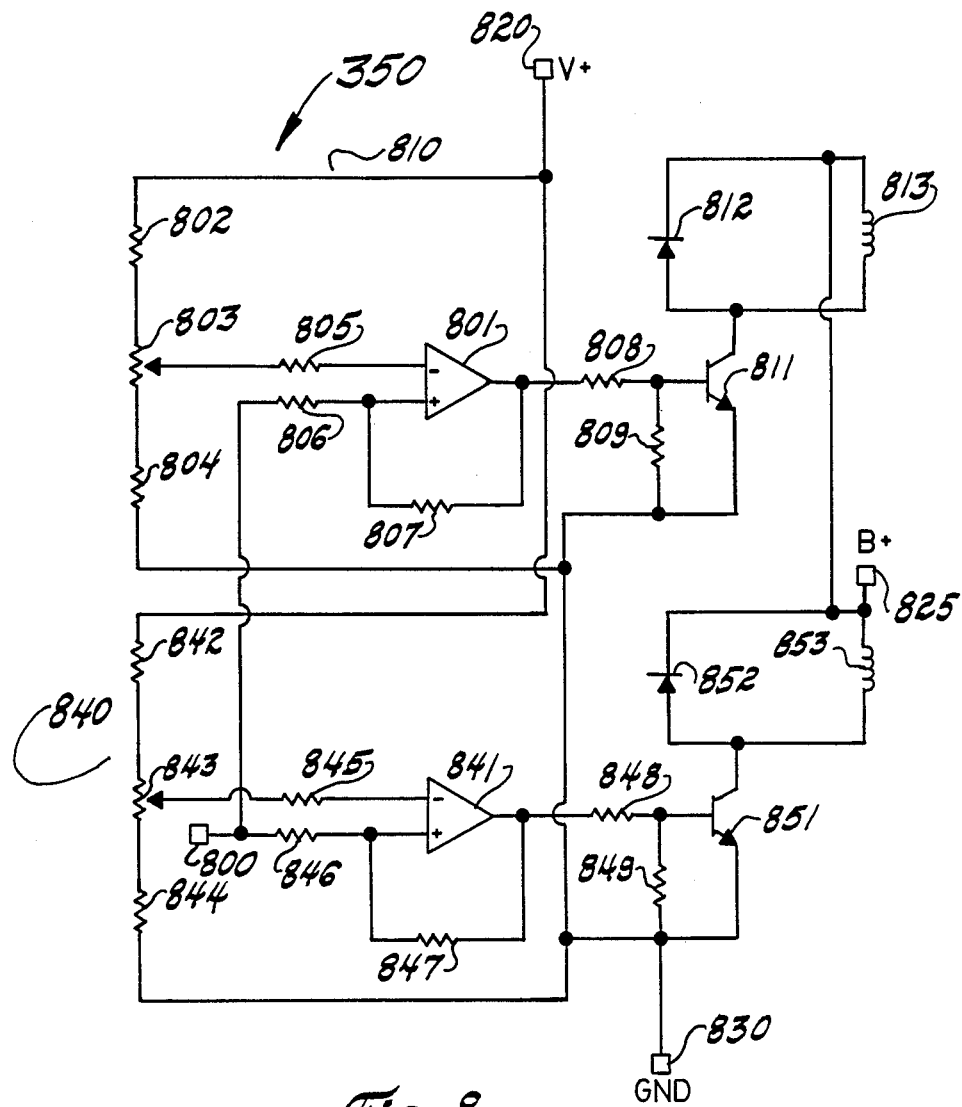
FIG. 8 is a schematic diagram of the micro relay driver output circuit in accordance with the preferred embodiment of the present invention.

The micro relay driver circuit 810 illustrated in FIG. 8 consists of two identical circuits 810 and 840. Each of these circuits is connected to receive the output signal from terminal 346 (the output of the sensing circuit) at terminal 800. For the sake of brevity only circuit 810 will be described. Although two circuits are shown, it would be understood by those skilled in the art that any number of relay circuits could be constructed, each with its own trip level.

Circuit 810 trips a relay 813 when the voltage level at input 800 exceeds a predetermined level. A voltage divider consisting of resistors 802 and 804 and potentiometer 803 is employed to set the trip level. The setting of potentiometer 803 sets voltage which is coupled to the inverting input of operational amplifier 801 via resistor 805. The input signal at terminal 800 is coupled to the noninverting input of operational amplifier 801 via resistor 806. Positive feedback is provided by resistor 807. Operational amplifier 801 is connected as a comparator. The output of operational amplifier is ground if the input voltage is less than the voltage set by potentiometer 803. The output of operational amplifier is the supply voltage V+ if the input voltage is greater than the voltage set by potentiometer 803. The positive feedback from resistor 807 ensures lockup when the input voltage exceeds the voltage set by potentiometer 803. The output of operational amplifier drives the base of transistor 811 via resistors 808 and 809. When the output voltage from operational amplifier is V+, transistor 811 is turned on to supply current to relay winding 813 from the B+ power supply at terminal 825. This causes the relay contacts (not shown) to switch. Diode 812 is provided to absorb the back voltage spike from relay coil 813 when transistor 811 is turned off, thereby protecting transistor 811.

We claim:

1. A current sensor for measuring the current flow in an electrical conductor comprising:
   a magnetic flux concentrator comprising a pair of magnetic pole structures disposed to substantially encircle the electrical conductor and spaced to have a magnetic sensing region therebetween, whereby electrical current flowing through the electrical conductor induces a magnetic field within said magnetic sensing region along a principle axis which is proportional to the electrical current;
   a magnetic field means disposed to generate a magnetic field within said magnetic sensing region along an axis substantially normal to said principle axis, said magnetic field along said substantially normal axis having a constant magnitude substantially unaffected by the flow of electrical current through the electrical conductor;
   a magneto resistive device disposed in said magnetic sensing region having a resistance proportional to the magnitude of magnetic field along said principle axis;
   a constant current source connected to said magneto resistive device for supplying a predetermined constant current to said magneto resistive device; and
   a voltage sensing circuit connected to said magneto resistive device for sensing the resistance proportional to the magnitude of magnetic field along said principle axis by sensing at least one voltage induced within said magneto resistive device by said constant current and generating a current indicative signal corresponding to said at least one induced voltage.

2. The current sensor for measuring the current flow in an electrical conductor claimed in claim 1, wherein:
   said magneto resistive device consists of a four magnetically sensitive resistors having approximately equal element resistances disposed in a Wheatstone bridge having first and second pairs of opposed terminals;
   said constant current source is connected to said magneto resistive device to supply said predetermined constant current through said first pair of opposed terminals; and
   said voltage sensing circuit is connected to said magneto resistive device to measure the differential voltage between said second pair of opposed terminals.

3. A current sensor for measuring the current flow in an electrical conductor comprising:
   a magnetic flux concentrator comprising a pair of magnetic pole structures disposed to substantially encircle the electrical conductor and spaced to have a magnetic sensing region therebetween, whereby electrical current flowing through the electrical conductor induces a magnetic field within said magnetic sensing region along a principle axis which is proportional to the electrical current;
   a magnetic field means disposed to generate a magnetic field within said magnetic sensing region along an axis substantially normal to said principle axis, said magnetic field along said substantially normal axis having a constant magnitude substantially unaffected by the flow of electrical current through the electrical conductor;
   a magneto resistive device consisting of four magnetically sensitive resistors having approximately equal resistances coupled in a Wheatstone bridge having first and second pairs of opposed terminals, said magneto resistive device disposed in said magnetic sensing region whereby each of said magnetically sensitive resistors has a resistance proportional to the magnitude of magnetic field along said principle axis;
   a constant current source connected to said magneto resistive device for supplying a predetermined constant current through said first pair of opposed terminals of said magneto resistive device; and
   a voltage sensing circuit connected to said magneto resistive device for sensing the differential voltage between said second pair of opposed terminals induced by said constant current and generating a current indicative signal corresponding to said differential voltage;
   said predetermined constant current being selected whereby the change with temperature of the differential voltage between said second pair of opposed terminals is equal and opposite to the change in voltage of the total bridge resistance with temperature and the change in the bridge offset voltage with temperature.

4. The current sensor for measuring the current flow in an electrical conductor claimed in claim 3, wherein: said constant current source consists of a Howland circuit including
an operational amplifier having an inverting input terminal, a noninverting input terminal and an output terminal,
a first resistor connected between said output terminal and said inverting input terminal,
a second resistor having an electrical resistance equal to the electrical resistance of said first resistor having a first terminal connected to said noninverting input terminal, and
a third resistor connected between said output terminal and said second terminal of said second resistor, said predetermined constant current of said constant current source being supplied from said connection between said second and third resistors, the resistance of said third resistor being approximately 28% of said element resistance of each of said four magnetically sensitively resistors if said element resistance is less than 10 kilo ohms and being approximately 18% of said element resistance if said element resistance exceeds than 10 kilo ohms.

5. The current sensor for measuring the current flow in an electrical conductor claimed in claim 3, wherein: said voltage sensing circuit includes
an operational amplifier having an inverting input terminal connected to a first terminal of said second pair of terminals, a noninverting input terminal connected to a second terminal of said second pair of terminals and an output terminal, the signal at said output terminal being said current indicative signal,
a first voltage divider circuit connected between said inverting input terminal and said output terminal consisting of two first resistors connected in series with a first node therebetween, each of said first resistors having a predetermined resistance,
a second voltage divider circuit connected between said noninverting input terminal and a ground potential consisting of two second resistors connected in series with a second node therebetween, each of said second resistors having said predetermined resistance, and
a variable resistance connected between said first node and said second node having a variable resistance for control of the gain of said voltage sensor.

6. The current sensor for measuring the current flow in an electrical conductor claimed in claim 5, wherein: said voltage sensing circuit further includes
an operator adjustable voltage divider circuit connected to said noninverting input, said operator adjustable voltage divider circuit permitting compensation for small variations in said magnetically sensitive resistors by permitting said current indicative signal to be set to zero when no electrical current passes through the electrical conductor.

7. The current sensor for measuring the current flow in an electrical conductor claimed in claim 6, wherein: said operator adjustable voltage divider circuit consists of a potentiometer connected across said first pair of terminals of said magneto resistive sensor having an operator adjustable contact connected to said noninverting terminal.

8. The current sensor for measuring the current flow in an electrical conductor claimed in claim 3, further comprising:
a current loop output circuit connected to said voltage sensing circuit for generating a current signal proportional to said current indicative signal.

9. The current sensor for measuring the current flow in an electrical conductor claimed in claim 3, further comprising:
a voltage to frequency output circuit connected to said voltage sensing circuit for generating an oscillatory signal having a frequency proportional to said current indicative signal.

10. The current sensor for measuring the current flow in an electrical conductor claimed in claim 3, further comprising:
at least one relay driver output circuit, each relay driver circuit connected to said voltage sensing circuit and including
an operator adjustable voltage divider circuit for generating an operator adjustable voltage,
a relay having a relay coil and at least one relay switch contact controlled by the energization of said relay coil, and
a comparator circuit connected to said voltage sensing circuit, said operator adjustable voltage divider and said relay, having a first input connected to said operator adjustable voltage divider, a second input receiving said current indicative signal and an output connected to said relay coil for energizing said relay coil only when said current indicative signal exceeds said operator adjustable voltage.

11. The current sensor for measuring the current flow in an electrical conductor claimed in claim 1, wherein: said magnetic field means includes at least one permanent magnet.

12. The current sensor for measuring the current flow in an electrical conductor claimed in claim 11, further comprising:
said at least one permanent magnet includes first and second permanent magnets disposed on opposite sides of said magnetic sensing region.

13. The current sensor for measuring the current flow in an electrical conductor claimed in claim 2, wherein: said current indicative signal of said voltage sensing circuit is reported in exact replication of magnitude, frequency and direction of current flow in said electrical conductor.

* * * * *